United States Patent
Tanaka

(10) Patent No.: US 10,892,148 B2
(45) Date of Patent: Jan. 12, 2021

(54) INFLATABLE SEAL FOR MEDIA COOLING

(71) Applicant: Seagate Technology LLC, Cupertino, CA (US)

(72) Inventor: Samuel Lewis Tanaka, San Leandro, CA (US)

(73) Assignee: SEAGATE TECHNOLOGY LLC, Fremont, CA (US)

(*) Notice: Subject to any disclaimer, the term of this patent is extended or adjusted under 35 U.S.C. 154(b) by 342 days.

(21) Appl. No.: 15/610,463

(22) Filed: May 31, 2017

(65) Prior Publication Data

US 2018/0350573 A1 Dec. 6, 2018

(51) Int. Cl.
| | | |
|---|---|---|
| *H01J 37/34* | (2006.01) | |
| *F16J 15/46* | (2006.01) | |
| *H01J 37/32* | (2006.01) | |
| *F28D 21/00* | (2006.01) | |
| *F28F 3/12* | (2006.01) | |

(52) U.S. Cl.
CPC .......... *H01J 37/3488* (2013.01); *F16J 15/46* (2013.01); *F28D 2021/0029* (2013.01); *F28F 3/12* (2013.01); *F28F 2230/00* (2013.01); *H01J 37/32522* (2013.01); *H01J 37/32788* (2013.01)

(58) Field of Classification Search
CPC ........ F28F 13/00; F28F 13/08; F28F 2230/00; F28F 3/12; H01J 37/3488; H01J 37/32788; H01J 37/32522; F28D 2021/0029; F16J 15/46
USPC ................. 204/298.09; 118/724; 156/345.53
See application file for complete search history.

(56) References Cited

U.S. PATENT DOCUMENTS

| | | | |
|---|---|---|---|
| 5,094,013 A * | 3/1992 | Martin | H01L 21/67017 34/62 |
| 5,415,729 A * | 5/1995 | Strasser | C23C 14/566 118/733 |
| 6,435,868 B2 | 8/2002 | White et al. | |
| 8,701,753 B2 | 4/2014 | Yi et al. | |
| 2004/0250996 A1 * | 12/2004 | Yi | H01L 21/67109 165/86 |

* cited by examiner

*Primary Examiner* — Rodney G McDonald
(74) *Attorney, Agent, or Firm* — Holzer Patel Drennan

(57) ABSTRACT

An apparatus includes a gas input and a cooling plate. A groove surrounds the gas input and less than one hundred percent of the cooling plate. An inflatable seal is in the groove.

7 Claims, 5 Drawing Sheets

INFLATABLE SEAL FOR MEDIA COOLING

BACKGROUND

During the manufacture of media (e.g. heat assisted magnetic recording ("HAMR") media), a carrier moves a workpiece between stations which form layers on the workpiece to create the finished media. Some stations heat the workpiece (e.g. during sputtering processes) and the workpiece undergoes cooling before further processing. After the workpiece is cooled, it proceeds to further processing. For example, a carrier may move a workpiece being manufactured into a first station which is a sputtering chamber where a layer is deposited on the workpiece. The sputtering process heats the workpiece, and the carrier transports the workpiece to a cooling station. In the cooling station, heat is absorbed from the workpiece and the workpiece is cooled.

SUMMARY

Provided herein is an apparatus including a cooling chamber. A first cooling plate is within the cooling chamber. A second cooling plate is positioned opposite the first cooling plate within the cooling chamber. A carrier is configured move a workpiece into the cooling chamber and position the workpiece between the first cooling plate and the second cooling plate. An inflatable seal surrounds a portion of the first cooling plate and the second cooling plate. The inflatable seal forms a gas channel between the first cooling plate and the second cooling plate when the inflatable seal is inflated.

Also provided herein is an apparatus including a first inflatable seal surrounding a number of cooling plates. A second inflatable seal also surrounds the cooling plates. The first inflatable seal and the second inflatable seal are configured to form a carrier channel when the first inflatable seal and the second inflatable seal are deflated. The carrier channel allows a carrier to position a workpiece between the cooling plates. The first inflatable seal and the second inflatable seal are configured to form a gas channel when the first inflatable seal and the second inflatable seal are inflated.

Also provided herein is an apparatus including a gas input and a cooling plate. A groove surrounds the gas input and less than one hundred percent of the cooling plate. An inflatable seal is in the groove.

These and other features and advantages will be apparent from a reading of the following detailed description.

DESCRIPTION

Figure 1:
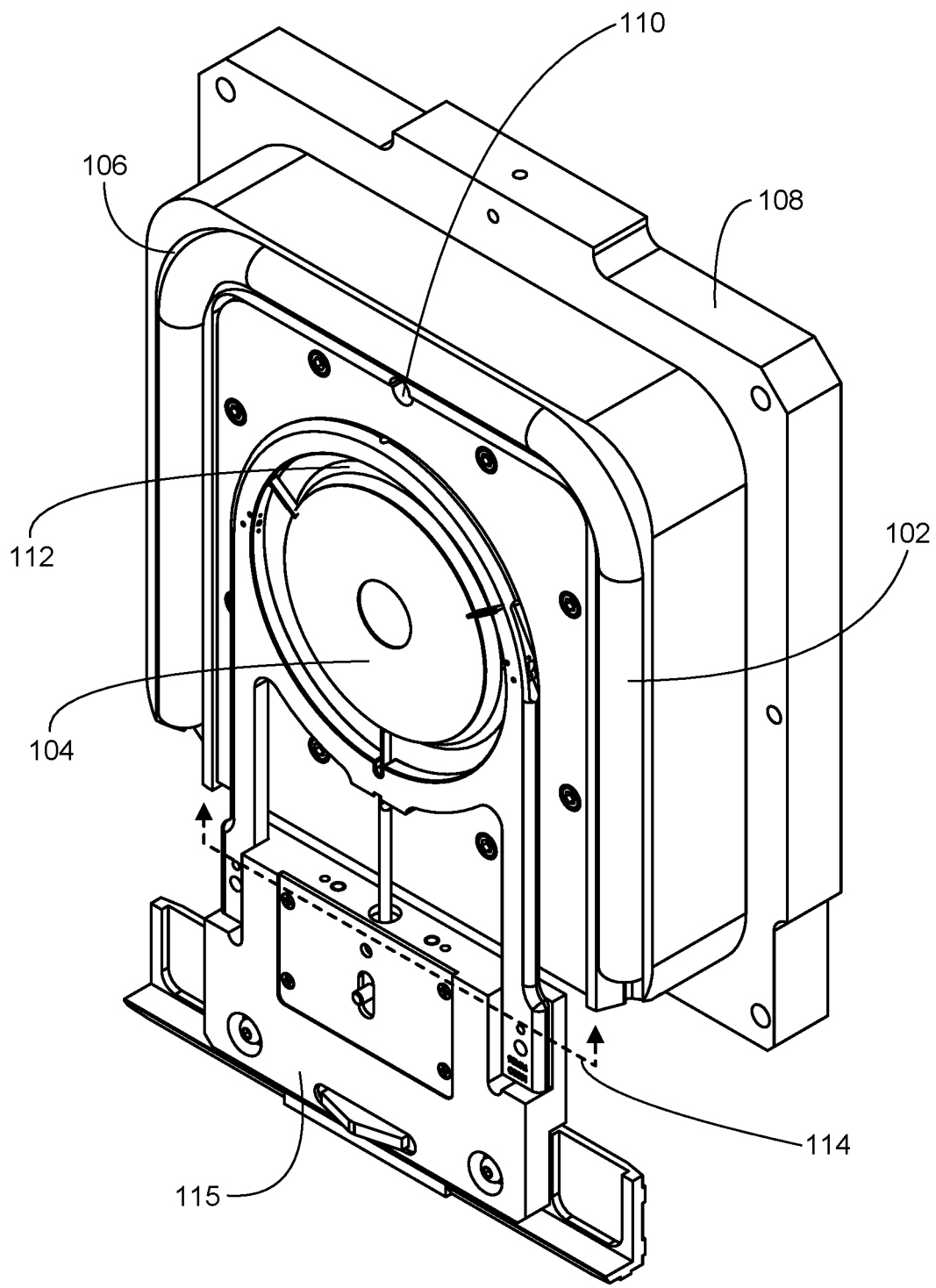
FIG. 1 shows an inflatable seal surrounding a workpiece according to one aspect of the present disclosure.

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse," "overlying," "underlying," "up," "down," or other similar terms such as "upper," "lower," "above," "below," "under," "between," "over," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Terms such as "over," "overlying," "above," "under," etc. are understood to refer to elements that may be in direct contact or may have other elements in-between. For example, two layers may be in overlying contact, wherein one layer is over another layer and the two layers physically contact. In another example, two layers may be separated by one or more layers, wherein a first layer is over a second layer and one or more intermediate layers are between the first and second layers, such that the first and second layers do not physically contact.

A disk drive media manufacturing process may include a carrier that moves a workpiece between stations. As the workpiece moves through the stations on the carrier, the workpiece may move in and out of chambers in which a number of processes form various layers on the workpiece to create the media. Some of the processes (e.g. sputtering processes) heat the workpiece. After the workpiece is heated, it may move to another station where the workpiece undergoes cooling before further processing. Cooling processes may use cooling plates on one or both sides of the workpiece to absorb heat and cool the workpiece. After the workpiece is cooled, it proceeds to further processing.

For example, a carrier may move a workpiece being manufactured into a first station. The first station may be a sputtering chamber where a layer is deposited on the workpiece. The sputtering process heats the workpiece, and the carrier transports the workpiece to a cooling station and into a cooling chamber. In the cooling chamber, the workpiece is positioned near one or more cooling plates, which absorb the heat and cool the workpiece.

According to some embodiments, an inflatable seal surrounds the cooling plates and the workpiece during the cooling process. Initially, the seal is deflated, allowing the carrier to position the workpiece in the cooling chamber between the cooling plates. After the carrier has positioned the workpiece, the seal inflates. A gas is then injected into the area surrounded by the seal and passes out through an opening in the seal. The input of gas through an injection port and out through the opening in the seal forces the gas past the workpiece and the cooling plates, thereby improving cooling of the workpiece.

Referring now to FIG. 1, an inflatable seal 102 surrounding a workpiece 104 is shown according to one aspect of the present disclosure. The inflatable seal 102 is positioned in a groove 106 in a heatsink 108. The heatsink 108 also includes both a gas injection inlet 110 above the workpiece 104 as well as a cooling plate 112 behind the workpiece 104. In the present FIG. 1, a carrier 115 holding the workpiece 104 has positioned the workpiece 104 in front of the cooling plate 112. In various embodiments, the workpiece 104 may be media (e.g. heat assisted magnetic recording ("HAMR") media) at various stages of manufacture.

The inflatable seal 102 surrounds the workpiece 104, the cooling plate 112, and the gas injection inlet 110. The inflatable seal 102 includes an opening 114 at the bottom of the heatsink 108. In the present embodiment, the opening 114 extends the length of the bottom of the heatsink 108. However, in various embodiments the opening 114 may be positioned anywhere in the heatsink 108 and the opening 114 may be any length. As such, the groove 106 and the inflatable seal 102 may surround less than one hundred percent of the workpiece 104, the cooling plate 112, and/or the gas injection inlet 110. In some embodiments, the inflatable seal 102 may be longer than, equal to, or shorter than the groove 106. In addition, the length of the inflatable seal 102 may be variable depending on the amount the inflatable seal 102 is inflated or deflated. For example, the inflatable seal 102 may be shorter than the groove 106 when the inflatable seal 102 is deflated. However, when the inflatable seal inflates, it may become equal to or longer than the groove 106.

Figure 2:
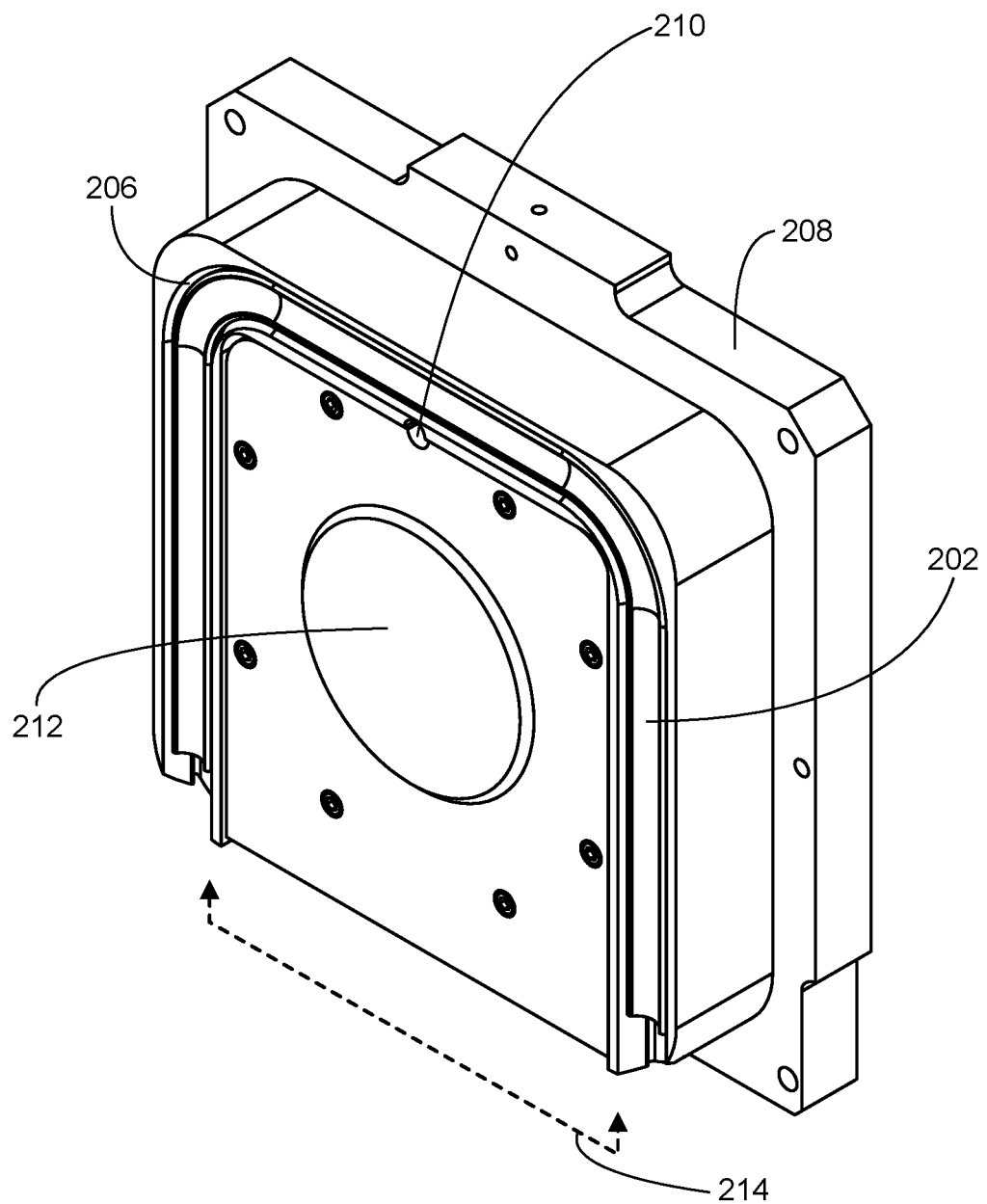
FIG. 2 shows a heatsink including a seal that is deflated according to one aspect of the present disclosure.

Referring now to FIG. 2, a heatsink 208 including a seal 202 that is deflated is shown according to one aspect of the present disclosure. The seal 202 is similar to the inflatable seal 102 (see FIG. 1) and can be inflated and deflated. The seal 202 is in a groove 206 surrounding a cooling plate 212 and a gas injection inlet 210 (e.g. gas input port). In the illustrated embodiment, the cooling plate 212 is positioned between the gas injection inlet 210 and an opening 214 in the seal 202. In various embodiments, the gas injection inlet 210 may be located anywhere in the heatsink 208, including behind the cooling plate 212.

In the present embodiment, the cooling plate 212 is depicted as annular. However, it is understood that the cooling plate 212 may be any shape, including regular and irregular shapes as well as polygons. In addition, the cooling plate 212 may be split into multiple cooling plates that are positioned at various locations on the heat sink 208 and surrounded by the groove 206 and the seal 202. In some embodiments, the cooling plate 212 may be larger or smaller than the workpiece 104 (see FIG. 1).

Figure 3:
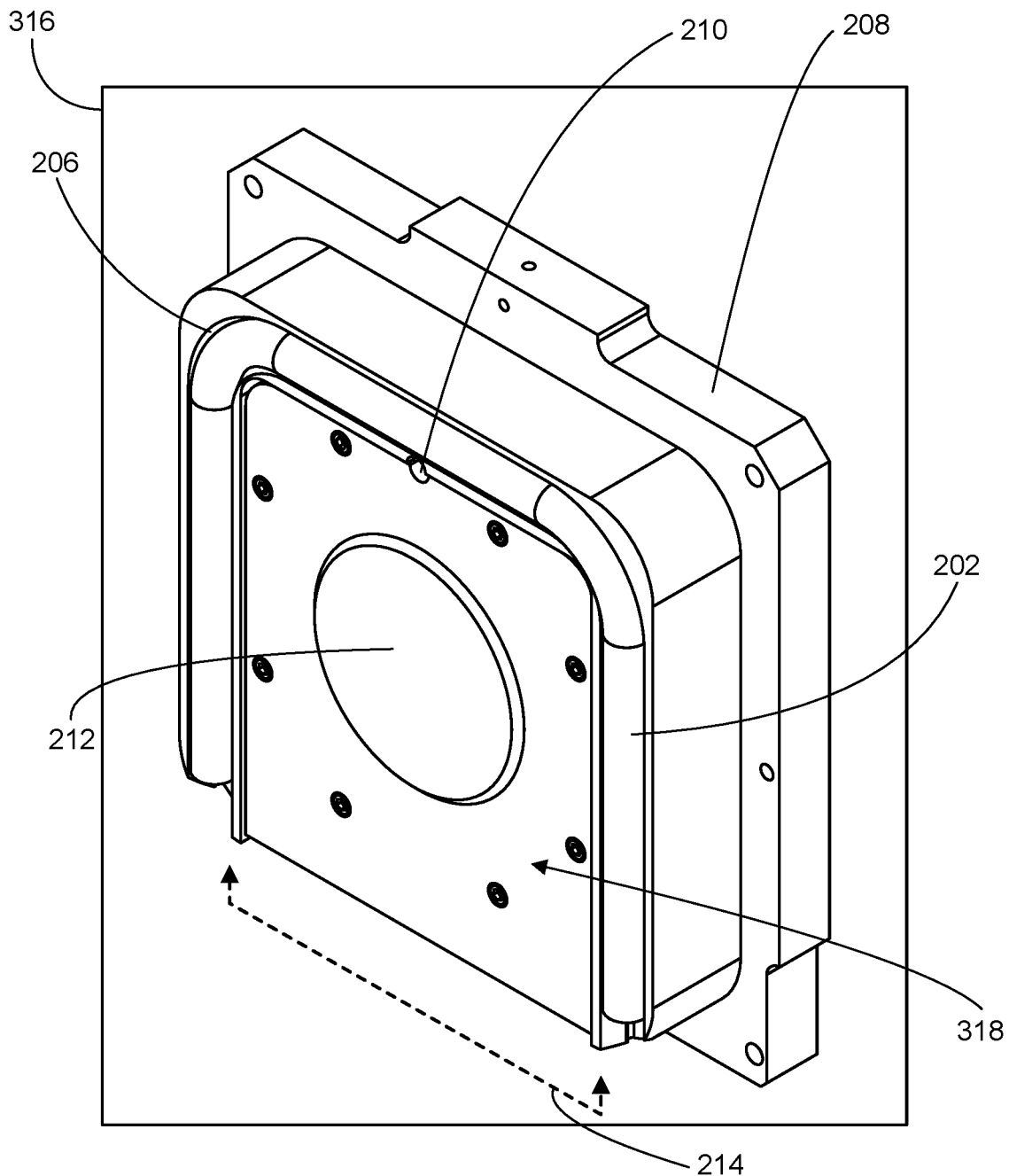
FIG. 3 shows the heatsink including the seal that is inflated according to one aspect of the present disclosure.

Referring now to FIG. 3, the heatsink 208 including the seal 202 that is inflated is shown according to one aspect of the present disclosure. The seal 202 has been inflated in the groove 206 with a gas. In various embodiments, any gas may be used to inflate the seal 202. In further embodiments, a liquid may also be used to inflate the seal 202. The gas and the liquid may be any gas and liquid that can be moved in and out of the seal 202 to inflate and deflate the seal 202.

As previously discussed, the seal 202 surrounds the cooling plate 212 and the gas injection inlet 210. When inflated, the seal 202 forms a gas channel that directs a flow of the gas from the gas injection inlet 210 past the cooling plate 212. The gas then flows from the cooling plate 212 out through the opening 214 in the seal 202. The gas may be, for example, helium, argon, nitrogen, or other gasses. In addition, the gas may be a combinations of gasses. In some embodiments, the gas is essentially free of contaminants.

For clarity of illustration, only the heatsink 208 is shown in FIG. 3 and a figurative representation of a cooling chamber 316 is depicted. When inflated, the seal 202 reduces an open volume 318 around the cooling plate 212 by isolating the open area around the cooling plate 212 from the larger open area in the cooling chamber 316 around the heatsink 208. As such, the gas flows from the open area around the cooling plate 212 into the larger open area in the cooling chamber 316 around the heatsink 208.

Figure 4:
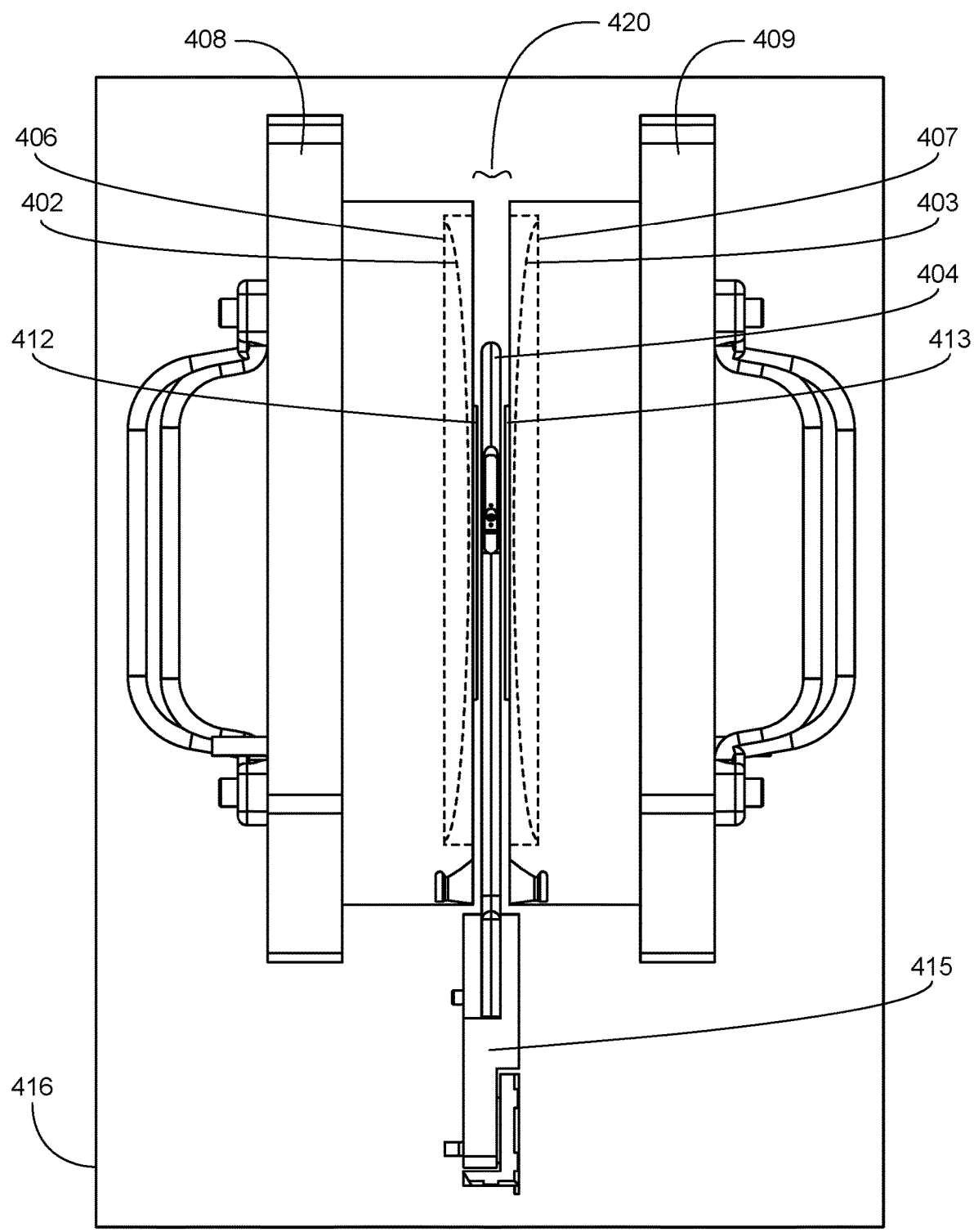
FIG. 4 shows a workpiece positioned between a first heatsink and a second heatsink within a cooling chamber according to one aspect of the present disclosure.

Referring now to FIG. 4, a workpiece 404 positioned between a first heatsink 408 and a second heatsink 409 within a cooling chamber 416 is shown according to one aspect of the present disclosure. The first heatsink 408 includes a first cooling plate 412. The second heatsink 409 includes a second cooling pate 413, positioned opposite the first cooling plate 412. A carrier 415 is configured to move the workpiece 404 into the cooling chamber 416 and position the workpiece 404 between the first cooling plate 412 and the second cooling plate 413.

An inflatable seal surrounds a portion of the first cooling plate 412 and a portion of the second cooling plate 413, leaving the bottom portion of the cooling plates open (as previously described). In various embodiments, the inflatable seal includes a first seal 402 in a first groove 406 in the first heatsink 408 as well as a second seal 403 in a second groove 407 of the second heatsink 409. The first groove 406 and the second groove 407 are positioned opposite each other. In further embodiments, the inflatable seal may include only one seal, such as the first seal 402 in the first groove 406 in the first heatsink 408. In still further embodiments, the first groove 406 with the first seal 402 may be positioned offset from the second groove 407 with the second seal 403. In such embodiments, the seals inflate against the opposing heatsink, thereby forming a double seal.

When deflated, the first seal 402 and the second seal 403 form a carrier channel 420 between the first cooling plate 412 and the second cooling plate 413. The carrier channel 420 allows the carrier 415 to position the workpiece 404 between the cooling plates (e.g. the first cooling plate 412 and the second cooling plate 413). For example, the workpiece 404 may be heated in another chamber as a result of, for example, a sputtering deposition process. The carrier 415 then moves the heated workpiece 404 from the sputtering chamber and into the cooling chamber 416. The carrier 415 moves the workpiece 404 through the carrier channel 420 to position the workpiece 404 between the first cooling plate 412 and the second cooling plate 413.

Figure 5:
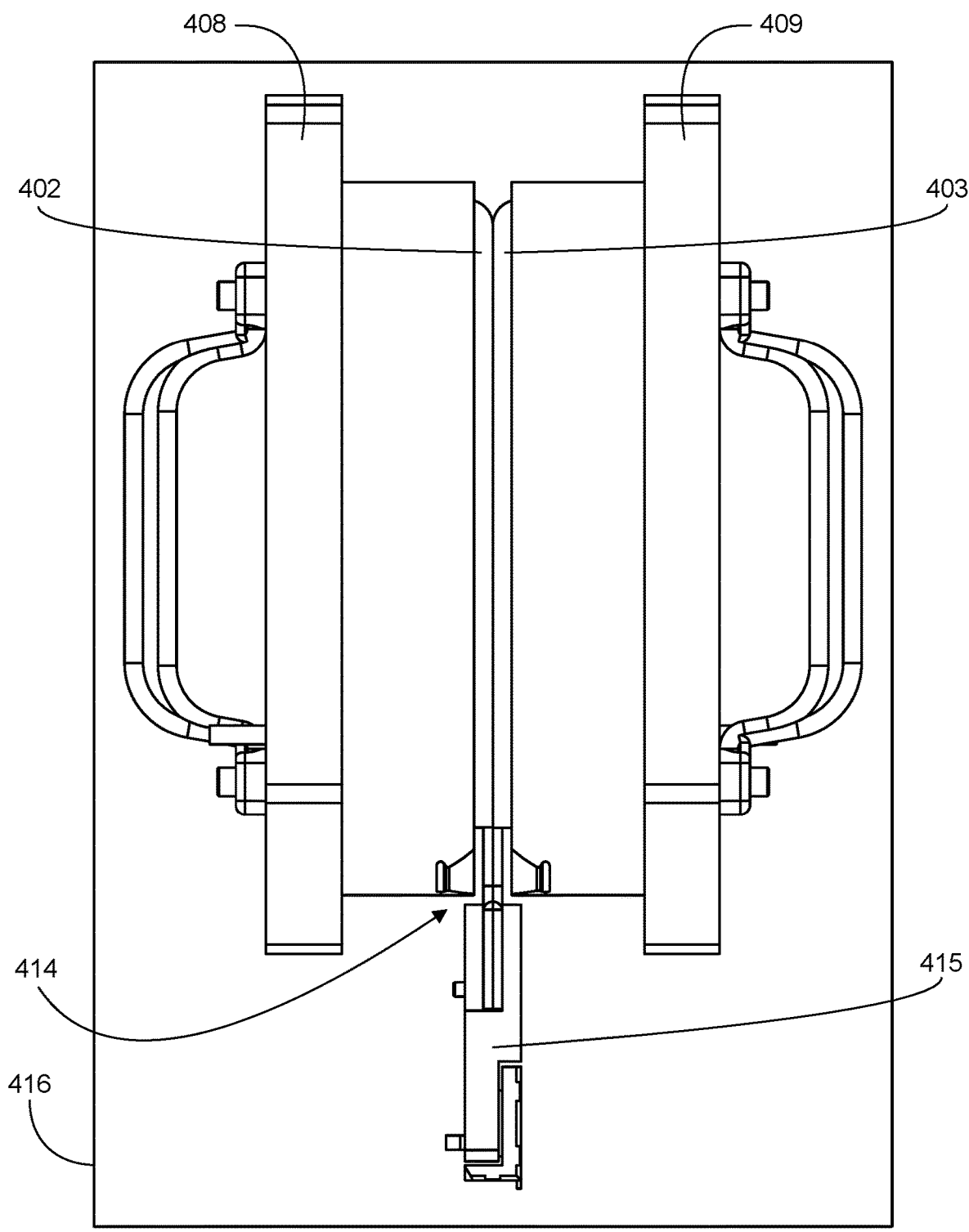
FIG. 5 shows the inflation of the first seal and the second seal according to one aspect of the present disclosure.

Referring now to FIG. 5, the inflation of the first seal 402 and the second seal 403 is shown according to one aspect of the present disclosure. As previously discussed, the first seal 402 and the second seal 403 do not completely surround the first cooling plate 412 (see FIG. 4) and the second cooling plate 413 (see FIG. 4) when the first seal 402 and the second seal 403 are inflated. As such, the inflated first seal 402 and the inflated second seal 403 form a gas channel that directs the flow of the gas from the gas injection inlet 210 (see FIG. 2) past the first cooling plate 412 and the second cooling plate 413. The gas continues to flow through the gas channel from the first cooling plate 412 and the second cooling plate 413 out through an opening 414 in the seal formed by the first seal 402 and the second seal 403.

When the first seal 402 and the second seal 403 inflate to form the gas channel, they block the carrier 415 from positioning the workpiece 404 (see FIG. 4) between the first cooling plate 412 and the second cooling plate 413. In addition, the inflated first seal 402 and second seal 403 block the carrier 415 from removing the workpiece 404 from between the first cooling plate 412 and the second cooling plate 413.

For example, the first seal 402 and the second seal 403 are in a deflated state, thereby forming the carrier channel 420. The carrier 415 is configured to move the workpiece 404 from another chamber where it has been heated and into the cooling chamber 416. The carrier 415 moves the workpiece 404 through the carrier channel 420 between the first heatsink 408 and the second heatsink 409. The carrier 415 positions the workpiece 404 between one or more cooling plates (e.g. first cooling plate 412 and second cooling plate 413).

The first seal 402 and the second seal 403 then inflate and block the carrier channel 420. The inflation of the first seal 402 and the second seal 403 forms the gas channel as described above. In some embodiments, the first seal 402 and the second seal 403 are positioned to inflate against each other. In further embodiments, only one seal may be present in one of the heatsinks. In such embodiments, the single seal inflates between the first heatsink 408 and the second heatsink 409.

After the workpiece 404 has been cooled, the first seal 402 and the second seal 403 deflate and separate, thereby removing the gas channel. The deflation and separation of the first seal 402 and the second seal 403 also reforms the carrier channel 420. The carrier 415 is then free to move the workpiece out through the carrier channel 420 for further processing.

In various embodiments, the first heatsink 408 and the second heatsink 409 may both be stationary, both be movable, or one may be movable and one may be stationary. In embodiments where one or both of the first heatsink 408 and the second heatsink 409 are movable, the heatsinks may move apart while the carrier is positioning the workpiece 220. After the workpiece 220 is positioned, the heatsinks may then move closer together.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A system comprising:
   a cooling chamber;
   a first cooling plate within the cooling chamber;
   a second cooling plate positioned opposite the first cooling plate within the cooling chamber;
   a carrier configured to move a workpiece into the cooling chamber and position the workpiece between the first cooling plate and the second cooling plate; and
   an inflatable seal surrounding a portion of the first cooling plate and the second cooling plate, wherein
   the inflatable seal forms a gas channel between the first cooling plate and the second cooling plate when the inflatable seal is inflated, and the inflatable seal removes the gas channel between the first cooling plate and the second cooling plate when the inflatable seal is deflated.

2. The apparatus of claim 1, wherein the inflatable seal blocks the carrier from positioning the workpiece between the first cooling plate and the second cooling plate when the inflatable seal is inflated.

3. The apparatus of claim 1, further comprising a gas inlet within the first cooling plate.

4. The apparatus of claim 3, wherein the gas channel is configured to direct a flow of gas from the gas inlet to the workpiece, and then from the workpiece to an opening in the inflatable seal.

5. The apparatus of claim 4, wherein the gas includes argon, nitrogen, or helium.

6. The apparatus of claim 1, wherein the inflatable seal forms a carrier channel between the first cooling plate and the second cooling plate when the inflatable seal is deflated.

7. The apparatus of claim 1, wherein the carrier is further configured to position the workpiece between the first cooling plate and the second cooling plate after the workpiece has been heated in a sputtering deposition process.

* * * * *